(12) United States Patent
Horikiri et al.

(10) Patent No.: US 8,829,694 B1
(45) Date of Patent: Sep. 9, 2014

(54) THERMOSETTING RESIN COMPOSITIONS WITH LOW COEFFICIENT OF THERMAL EXPANSION

(71) Applicant: Henkel Corporation, Rocky Hill, CT (US)

(72) Inventors: Masashi Horikiri, Kanagawa (JP); Jie Bai, Aliso Viejo, CA (US)

(73) Assignee: Henkel IP & Holding GmbH, Duesseldorf (DE)

( * ) Notice: Subject to any disclaimer, the term of this patent is extended or adjusted under 35 U.S.C. 154(b) by 0 days.

(21) Appl. No.: 13/840,171

(22) Filed: Mar. 15, 2013

(51) Int. Cl.
*H01L 23/29* (2006.01)
*C08K 5/101* (2006.01)
*H01L 21/56* (2006.01)

(52) U.S. Cl.
CPC ............... *C08K 5/101* (2013.01); *H01L 23/295* (2013.01); *H01L 21/56* (2013.01)
USPC ............ 257/789; 257/795; 438/126; 438/127

(58) Field of Classification Search
USPC ........................... 257/789, 795; 438/126, 127
See application file for complete search history.

(56) References Cited

U.S. PATENT DOCUMENTS

2013/0009327 A1* 1/2013 Tanaka .......................... 257/789
2013/0296453 A1* 11/2013 Giesenberg et al. ............ 522/34

* cited by examiner

*Primary Examiner* — Phat X Cao
(74) *Attorney, Agent, or Firm* — Steven C. Bauman

(57) ABSTRACT

Thermosetting resin compositions with low coefficient of thermal expansion are provided herein.

17 Claims, No Drawings

THERMOSETTING RESIN COMPOSITIONS WITH LOW COEFFICIENT OF THERMAL EXPANSION

BACKGROUND

1. Field

The invention relates to thermosetting resin compositions with low coefficient of thermal expansion are provided herein.

2. Brief Description of Related Technology

Low dielectric constant ("low-k") dielectric materials (or interlayer dielectric layers, "ILD's") continue play an important role in the future development of advanced integrated circuit manufacturing. Low-k ILD's are used in integrated circuit manufacturing to insulate copper interconnects from their surroundings, ensuring less cross talk between interconnections. Cross talk is a common problem in integrated circuit manufacturing, as it causes malfunction in the circuit. Cross talk becomes even more pronounced as the size of the integrated circuit continues to shrink.

As the industry continues to seek advanced materials for circuit boards (moving from ceramic to composite), semiconductor chips that are inherently more fragile (due to their ever-reduced thickness) though with greater computing capability, finer pitch, increased density of solder ball placement and smaller diameter solder balls themselves, and increased reflow temperatures due to the conversion of leaded solders to lead free solders, greater stresses due to warpage and shock are observed in the semiconductor packages being designed today than ever before.

Conventional commercial underfill sealant materials, such as low coefficient of thermal expansion ("CTE"), high modulus, epoxy-based underfill sealant materials appear to be incapable of providing the necessary protection against package stresses to prevent damage to the fragile low-k ILD's. The low-k ILD's, being fragile in nature, are generally weaker and more brittle than conventional ILD materials, such as silicon oxides, silicon nitrides, fluorinated silicon glass, and the like, and as a result lead to fracture and cracks during thermal excursions due to induced stresses.

In addition, liquid compression molding materials could benefit from a similar set of physical properties. For instance, in fan-out wafer level packaging applications in the semiconductor packaging industry, protective materials are coated on a metal carrier on which is disposed one or more diced silicon dies picked and then placed thereon. The gaps and edges around the silicon dies are filled with the protective material to form a molded wafer.

Conventional materials used to form the molded wafer have either not possessed the desired physical properties to offer improved resistance to wafer warpage, or have not lent themselves to application by liquid compression molding techniques.

It would be desirable therefore to provide encapsulation by liquid compression molding to silicon wafers materials suitable for application, which are thermosetting resin compositions capable of providing improved resistance to wafer warpage.

In the past, silica fillers have been used to accommodate the mismatch of CTE between semiconductor chips and circuit boards or carrier substrates. One way to reduce CTE of a silica filled thermosetting resin composition is to increase the amount of the silica used. However, increasing the silica content comes with a price; the viscosity tends to increase, oftentimes to levels rendering the composition unsuitable for some applications. Sometimes the surfaces of the silica fillers have been modified with hexamethyldisiloxane, dimethoxy silane and 3-glycidoxypropyltrimethoxy silane to name a few surface modifiers. Despite the use of these surface modifiers, the CTE of silica-filled thermosetting resin compositions have not approached a sufficiently low level to reach certain desired physical property targets.

It would be desirable therefore to provide electronic packaging materials suitable for advanced applications, such as thermosetting resin compositions useful for FC underfill sealant materials, which are compatible for use with low-k ILD's and reduce the internal package stresses that lead to ILD cracking failures. In addition, it would be desirable to provide electronic packages assembled with such thermosetting resin compositions, provide methods of manufacturing such electronic packages that provide enhanced physical properties, and provide methods of providing thermosetting resin compositions having a physical property profile in terms of reduced modulus and CTE that make such compositions particularly attractive to high stress FC underfill sealant applications in semiconductor packaging.

SUMMARY

In one aspect, a thermosetting resin composition is provided, comprising:

(a) a thermosetting resin component;
(b) a curative; and
(c) a lactone-modified silica filler.

In another aspect, a mounting structure for semiconductor devices is also provided. The mounting structure includes:

a semiconductor device comprising a semiconductor chip mounted on a carrier substrate, and a circuit board to which the semiconductor device is electrically connected.

The space between the carrier substrate of the semiconductor device and the circuit board should be sealed with a reaction product of the inventive composition.

In another aspect, a process for fabricating semiconductor devices is also provided. The process includes the steps of:

electrically connecting a semiconductor device comprising a semiconductor chip mounted on a carrier substrate, to a circuit board;

infiltrating the inventive composition into the space between the carrier substrate of the semiconductor device and the circuit board; and curing the composition by the application of heat.

In still another aspect, a method of reducing the coefficient of thermal expansion of a thermosetting resin composition is also provided. The method involves the steps of:

(a) providing a thermosetting resin component;
(b) providing a lactone-modified silica filler; and
(c) forming a premix of the thermosetting resin component and the lactone-modified silica filler; and
(d) providing a hardener to the premix so formed.

In yet another aspect, provided is a method of improving warpage resistance to a silicon wafer, steps of which include:

providing a silicon wafer;

providing the inventive composition as so described in contact with the silicon wafer; and exposing the silicon wafer and the thermosetting resin composition to conditions favorable to allow the thermosetting resin composition to flow about the silicon wafer and cure to a reaction product of the thermosetting resin composition.

DETAILED DESCRIPTION

Provided herein is a thermosetting resin composition, comprising:
(a) a thermosetting resin component;
(b) a curative; and
(c) a lactone-modified silica filler.

The thermosetting resin component should include at least one multifunctional epoxy resin. Examples of the multifunctional epoxy resins include $C_6$-$C_{28}$ alkyl glycidyl ethers; $C_6$-$C_{28}$ fatty acid glycidyl esters; $C_6$-$C_{28}$ alkylphenol glycidyl ethers; polyglycidyl ethers of pyrocatechol, resorcinol, hydroquinone, 4,4'-dihydroxydiphenyl methane (or, bisphenol F epoxy resin), 4,4'-dihydroxy-3,3'-dimethyldiphenyl methane, 4,4'-dihydroxydiphenyl dimethyl methane (or, bisphenol A epoxy resin), 4,4'-dihydroxydiphenyl methyl methane, 4,4'-dihydroxydiphenyl cyclohexane, 4,4'-dihydroxy-3,3'-dimethyldiphenyl propane, 4,4'-dihydroxydiphenyl sulfone, and tris(4-hydroxyphyenyl)methane; polyglycidyl ethers of the chlorination and bromination products of the above-mentioned diphenols; polyglycidyl ethers of novolacs; polyglycidyl ethers of diphenols obtained by esterifying ethers of diphenols obtained by esterifying salts of an aromatic hydrocarboxylic acid with a dihaloalkane or dihalogen dialkyl ether; polyglycidyl ethers of polyphenols obtained by condensing phenols and long-chain halogen paraffins containing at least two halogen atoms; N,N'-diglycidyl-aniline; N,N'-dimethyl-N,N'-diglycidyl-4,4'-diaminodiphenyl methane; N,N,N',N'-tetraglycidyl-4,4'-diaminodiphenyl methane; N-diglycidyl-4-aminophenyl glycidyl ether; N,N,N',N'-tetraglycidyl-1,3-propylene bis-4-aminobenzoate; phenol novolac epoxy resin; and cresol novolac epoxy resin.

The thermosetting resin component may also include coreactants, such as oxazines (like benzoxazines), oxazolines, episulfides, oxetanes, cyanate esters, maleimides, madimides, itaconanibles, and (meth)acrylates.

The thermosetting resin component should be used in an amount of within the range of about 5 percent by weight to about 50 percent by weight, desirably about 10 percent by weight to about 40 percent by weight, such as about 15 percent by weight.

The lactone of the lactone-modified silica filler ordinarily should be a caprolactone, like an epsilon-caprolactone. However, other lactones having three to eight cyclic aliphatic ring markers may be used. In some instances, the epsilon-caprolactone is grafted onto the silica filler. In those instances, the caprolactone-modified silica filler is formed by contacting the caprolactone with the silica filler in the presence of an organometallic complex prior to mixing with the thermosetting resin component and the hardener component. The organometallic complex used there should be a metal alkoxide selected from titanium (IV) isopropoxide, titanium (IV) n-butoxide, titanium (IV) tert-butoxide, titanium (IV) 2-ethylhexyloxide, zirconium (IV) n-propoxide or zirconium (IV) n-butoxide. The amount of the organometallic complex used should be about 5 to about 15 mole percent relative to the amount used of the caprolactone.

The silica filler modified by the lactone should have a mean particle size distribution in the 0.1 to 50 micron range. A commercially available example of such particles is sold by Tatsumori or Denka in Japan.

The lactone-modified silica filler should be used in an amount of about 40 to about 95 percent by weight of the composition, such as about 50 to about 92 percent by weight, desirably within the range of about 60 to about 90 percent by weight.

In addition to the lactone-modified silica filler, supplemental silica filler may also be used. The supplemental silica filler may be chosen from any of these noted herein (though without the lactone modified surface).

The curative in some instances should be a Lewis base selected from an aliphatic tertiary amine, an adimine, triphenyl phosphine and combinations thereof. The curative in other instances should be a latent curative, such as one selected from imidazole, isoimidazole, 2-methyl imidazole, 2-ethyl-4-methylimidazole, 2,4-dimethylimidazole, butylimidazole, 2-heptadecenyl-4-methylimidazole, 2-undecenylimidazole, 1-vinyl-2-methylimidazole, 2-n-heptadecylimidazole, 2-undecylimidazole, 2-heptadecylimidazole, 2-phenylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole and addition products of an imidazole methylimidazole and addition products of an imidazole and trimellitic acid, 2-n-heptadecyl-4-methylimidazole, phenylimidazol, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole, 1-benzyl-2-methylimidazole, 2-p-methoxystyrylimidazole, 2-phenyl-4,5-dihydroxymethylimidazole, 1,8-diazabicyclo[5.4.0]undec-7-ene, 1,5-diazabicyclo[4.3.0]non-5-ene, and epoxy adducts and borate salts thereof, and encapsulated versions thereof, and combinations thereof.

The curative should be used in an amount of about 2 to about 15 mole percent such as about 5 to about 10 mole percent, relative to the thermosetting resin component.

Reaction products of the inventive compositions are also provided herein.

In order to form such reaction products, exposure to elevated temperature conditions should occur. Desirably, the elevated temperature conditions are greater than about 80° C., such as about 100° C.-130° C. for a period of time of about 10-30 minutes followed by exposure to an elevated temperature of about 140-150° C. for a period of time of about 2-3 hours.

A mounting structure for semiconductor devices is also provided herein. The mounting structure includes a semiconductor device comprising a semiconductor chip mounted on a carrier substrate, and a circuit board to which the semiconductor device is electrically connected.

The space between the carrier substrate of the semiconductor device and the circuit board should be sealed with a reaction product of the inventive composition.

A process for fabricating semiconductor devices is also provided herein. The process includes the steps of:

electrically connecting a semiconductor device comprising a semiconductor chip mounted on a carrier substrate, to a circuit board;

infiltrating the inventive composition into the space between the carrier substrate of the semiconductor device and the circuit board; and curing the composition by the application of heat.

In these aspects, the electrical connection may be a conductive material like solder, such as one of the following solder alloys: Sn(63):Pb(37), Pb(95):Sn(5), Sn:Ag(3.5):Cu (0.5) and Sn:Ag(3.3):Cu(0.7), or a combination of copper pillars and solder interconnection.

A method of reducing the coefficient of thermal expansion of the inventive composition is also provided herein. The method involves the steps of:

(a) providing a thermosetting resin component;
(b) providing a lactone-modified silica filler; and
(c) forming a premix of the thermosetting resin component and the lactone-modified silica filler; and
(d) providing a hardener to the premix so formed.

The inventive composition so formed should have a coefficient of thermal expansion, alpha 1 of at least 4 ppm/° C., such as in the range of about 4 to about 9 ppm/° C.

In still another aspect, provided is a method of improving warpage resistance to a silicon wafer, steps of which include:

providing a silicon wafer;
providing the inventive composition as so described in contact with the silicon wafer; and
exposing the silicon wafer and the thermosetting resin composition to conditions favorable to allow the thermosetting resin composition to flow about the silicon wafer and cure to a reaction product of the thermosetting resin composition. The cured reaction product is capable of improving warpage resistance of the silicon wafer by 20%, desirably at least about 50%, and even more desirably at least about 80%, as compared with a silicon wafer either without cured reaction product or with a material other than that which is disclosed herein.

In the context of liquid compression molding encapsulation, the inventive composition may be dispensed onto a silicon wafer and encapsulated. The so-encapsulated silicon wafers offer improved resistance to warpage, compared to unencapsulated wafers or wafers encapsulated with known encapsulation materials.

EXAMPLES

Lactone-Modified Silica Filler

ε-Caprolactone in an amount of 5.7 percent by weight, titanium (IV) tetrabutoxide in an amount of 1.7 percent by weight and silica filler (UHR-500S, available commercially from Tatsumori LTD.) in an amount of 92.6 percent by weight were mixed together at a temperature of 25° C. for about 15 minutes and then 50° C. for about 120 minutes to form an example of the caprolactone-modified silica filler.

Thermosetting Resin Compositions

Sample Nos. 1-3 were made from the identified constituents in the amounts noted in Table 1. Sample No. 1 is shown for comparative purposes, as it represents an epoxy/anhydride system with silica filled with a silica that has not been modified by ε-caprolactone.

TABLE 1

| Constituents | | Sample Nos./Amt. (wt %) | | | |
|---|---|---|---|---|---|
| Type | Identity | 1 | 2 | 3 | 4 |
| Epoxy | RSL-1462[1] | 0.88 | | | |
| | RSL-1739[2] | 0.44 | | | |
| | HELOXY 68 | 0.74 | | | |
| | CYRACURE UVR-6105[3] | 1.18 | | | |
| | ARALDITE MY 510 | 0.74 | | | |
| | Trifunctional epoxy resin | | 2.5 | 2.5 | 2.54 |
| Curative | Imidazole | | 0.3 | 0.3 | 0.29 |
| | CUREZOL 1B2MZ | 0.2 | | | |
| | ECA 300D[4] | 5.26 | | | |

TABLE 1-continued

| Constituents | | Sample Nos./Amt. (wt %) | | | |
|---|---|---|---|---|---|
| Type | Identity | 1 | 2 | 3 | 4 |
| Silica Filler | Caprolactone-modified UHR-500S | | 62.5 | | |
| | UHR-500S | | 30.7 | 88.43 | 88.43 |
| | MSV-8000 | 46.80 | | | |
| | MSR-8030 | 43.00 | | | |
| | AEROSIL R8200 | 0.2 | | | |
| Additives | BYK-9076 | | 0.6 | 0.6 | 0.64 |
| | Carbon black | | 0.8 | 0.8 | 0.84 |
| | Defoamer | | 0.05 | 0.05 | 0.06 |
| | SILQUEST A-187 J | 0.15 | | | |
| | SILRES HP-1250 | 0.35 | | | |
| | Capa 2047A Polycaprolactone diol | | | | 4.75 |

1. Bisphenol A epoxy resin, Resolution Performance Products LLC, Houston, TX
2. Bisphenol F epoxy resin, Resolution Performance Products LLC, Houston, TX.
3. CYRACURE UVR-6105, cycloaliphatic epoxy
4. Alicyclic anhydride The compositions were each prepared by mixing together the epoxy constituents with a mechanical mixer until dissolution to a homogeneous solution was observed. The silica filler was then added with continued mixing for a period of time of about 30-90 minutes at a temperature of about 50° C., followed by the curative with an additional 30 minutes of mixing at that 20° C. A viscous paste with a substantially uniform consistency was formed, and then transferred into containers until ready for use. Physical properties, such as viscosity, modulus, glass transition temperature, and coefficient of thermal expansion were measured, and are shown in Table 2.

TABLE 2

| | Sample Nos. | | | |
|---|---|---|---|---|
| Physical Properties | 1 | 2 | 3 | 4 |
| Viscosity @ 5 rpm, cps | 305,000 | 258,300 | — | 137,300 |
| Storage Modulus @ RT, Gpa | 27,300 | 19 | 19.2 | 8.88 |
| Cured Modulus @ 150° C., Gpa | — | — | 11.1 | 0.68 |
| CTE $\alpha_1$ (ppm/K) | 8 | 5 | 8 | no clear CTE |
| CTE $\alpha_2$ (ppm/K) | 31 | 7 | 30.5 | no clear CTE |
| $T_g$, °C. | 115 | 148 | 137 | 61 broad (by DMA) |

Liquid Compression Molding

A silicon wafer is ordinarily constructed today to have an 8" or 12" diameter, and a thickness of about 25 um to 300 um. In use, the thermosetting resin composition used to encapsulate the silicon wafer may be dispensed by air pressure or by piston dispense on or about a central portion of the silicon wafer.

Exposure to liquid compression molding conditions, such as at a temperature of about 110° C. to 150° C. for a period of time of about 5 minutes to 10 minutes, follows. See e.g. FIG. 1. After such exposure, the compression molded silicon wafer may be placed into a conventional oven for a post mold cure at a temperature about 120° C. to 150° C. for a period of time of about 1 to 2 hours. Desirably, a 12", 50 um thick silicon wafer should demonstrate warpage about less than 1 mm, after post mold cure, or for 8" silicon wafers, less than 0.5 mm bow across of the wafer.

For liquid compression molding applications, the thermosetting resin compositions are dispensed onto and about the center of a silicon wafer. After compression molding at a temperature of 110° C. to 150° C. for a period of time of 5 minutes to 10 minutes, the composition is observed to be about 70 to 80% cured, though with a tack free surface. Then, the so-molded wafer is placed into a conventional oven for post mold cure at a temperature of 120° C. to 150° C. for a period of time of 1 to 2 hours.

To achieve high Tg and low warpage on flip chip semiconductor packaging, low temperature curing conditions (below 130° C.), with compositions that exhibit fast gellation after exposure to such low temperature curing conditions have been shown to influence warpage. The Tg of the cured composition should be equal to or higher than the temperature used to cure the composition; the Tg should be higher than 90° C., desirably above 125° C. If the composition cures slowly or at a higher temperature, the stress free point between the die and substrate set is high. Warpage at room temperature results from cooling the compression molded semiconductor package to room temperature from the cure temperature.

To achieve high reliability for thermal cycle performance between −55° C. to 125° C. of such compression molded semiconductor packages, the underfill material should have Tg by TMA after reflow at 260° C. above 90° C. and desirably above 125° C., a DSC peak below 140° C., a delta temperature between the onset and the peak on DSC below 20° C.

A control sample (Sample No. 1), prepared from bisphenol-A epoxy, cycloaliphatic epoxy and anhydride, was applied to a carrier on which is disposed silicon chips and molded as described above. Warpage of the molded wafer was observed to be modest using a Shadow Moiré in the X- and Y-directions, which uses non-contact and non-destructive methods to measure a whole-field surface topography of the molded wafers.

Using this technique, the warpage of the debonded wafer was measured. Then the wafer was annealed using a different temperature ramping process and the warpage was measured again.

As silica filler loading increases, viscosity increases tend to result and reduced flow and challenging dispensability is ordinarily observed.

And warpage results are shown in Table 3 below for Sample No. 1 and Sample Nos. 2, 3 and 4, which are otherwise comparable to Sample No. 1. The molding was done on 8" full thickness blank Si wafers; the mold cap thickness is around 300 um.

TABLE 3

| Physical Property | Sample Nos./cm | | | |
|---|---|---|---|---|
| | 1 Control | 2 | 3 | 4 |
| Warpage after post mold cure | 8 | 5 | 10 | 8 |

What is claimed is:

1. A thermosetting resin composition, comprising:
   (a) a thermosetting resin component;
   (b) a curative; and
   (c) a lactone-modified silica filler.

2. The composition of claim 1, wherein the caprolactone of the caprolactone-modified silica filler is epsilon-caprolactone.

3. The composition of claim 2, wherein the epsilon-caprolactone is grafted onto silica filler.

4. The composition of claim 1, wherein the lactone-modified silica filler is formed by contacting caprolactone with silica filler in the presence of an organometallic complex prior to mixing with the thermosetting resin component and the curative.

5. The composition of claim 4, wherein the organometallic complex is a metal alkoxide selected from the group consisting of titanium(IV) isopropoxide, titanium(IV) n-butoxide, titanium(IV) tert-butoxide, titanium(IV) 2-ethylhexyloxide, zirconium(IV) n-propoxide and zirconium(IV) n-butoxide.

6. The composition of claim 4, wherein the amount of the organometallic complex used is about 5 to about 10 mol % relative to the amount used of the caprolactone.

7. The composition of claim 1, wherein the curative is a Lewis base selected from the group consisting of an aliphatic tertiary amine, an adimine, triphenylphosphine and combinations thereof.

8. The composition of claim 1, wherein the curative is latent.

9. The composition according to claim 1, wherein the curative is selected from the group consisting of imidazole, isoimidazole, 2-methyl imidazole, 2-ethyl-4-methylimidazole, 2,4-dimethylimidazole, butylimidazole, 2-heptadecenyl-4-methylimidazole, 2-undecenylimidazole, 1-vinyl-2-methylimidazole, 2-n-heptadecylimidazole, 2-undecylimidazole, 2-heptadecylimidazole, 2-phenylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole and addition products of an imidazole methylimidazole and addition products of an imidazole and trimellitic acid, 2-n-heptadecyl-4-methylimidazole, phenylimidazol, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethyl-aminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole, 1-benzyl-2-methylimidazole, 2-p-methoxystyrylimidazole, 2-phenyl-4,5-dihydroxymethylimidazole, 1,8-diazabicyclo[5.4.0]undec-7-ene, 1,5-diazabicyclo[4.3.0]non-5-ene, and epoxy adducts and borate salts thereof, and encapsulated versions thereof, and combinations thereof.

10. The composition of claim 1, wherein the thermosetting resin component comprises at least one multifunctional epoxy resin.

11. The composition according to claim 1, wherein the thermosetting resin component includes members selected from the group consisting of $C_6$-$C_{28}$ alkyl glycidyl ethers; $C_6$-$C_{28}$ fatty acid glycidyl esters; $C_6$-$C_{28}$ alkylphenol glycidyl ethers; polyglycidyl ethers of pyrocatechol, resorcinol, hydroquinone, 4,4'-dihydroxydiphenyl methane, 4,4'-dihydroxy-3,3'-dimethyldiphenyl methane, 4,4'-dihydroxydiphenyl dimethyl methane, 4,4'-dihydroxydiphenyl methyl methane, 4,4'-dihydroxydiphenyl cyclohexane, 4,4'-dihydroxy-3,3'-dimethyldiphenyl propane, 4,4'-dihydroxydiphenyl sulfone, and tris(4-hydroxyphyenyl)methane; polyglycidyl ethers of the chlorination and bromination products of the above-mentioned diphenols; polyglycidyl ethers of novolacs; polyglycidyl ethers of diphenols obtained by esterifying ethers of diphenols obtained by esterifying salts of an aromatic hydrocarboxylic acid with a dihaloalkane or dihalogen dialkyl ether; polyglycidyl ethers of polyphenols obtained by condensing phenols and long-chain halogen paraffins containing at least two halogen atoms; N,N'-diglycidyl-aniline; N,N'- dimethyl-N,N'-diglycidyl-4,4'-diaminodiphenyl methane; N,N,N',N'-tetraglycidyl-4,4'-diaminodiphenyl methane; N-diglycidyl-4-aminophenyl glycidyl ether; N,N,N',N'-tetraglycidyl-1,3-propylene bis-4-aminobenzoate;

phenol novolac epoxy resin; and cresol novolac epoxy resin.

12. Reaction products of the composition according to claim 1.

13. A mounting structure for semiconductor devices, comprising:

a semiconductor device comprising a semiconductor chip mounted on a carrier substrate, and a circuit board to which said semiconductor device is electrically connected, wherein the space between the carrier substrate of said semiconductor device and said circuit board is sealed with a reaction product of the composition according to claim 1.

14. A process for fabricating semiconductor devices, said process comprising the steps of:

electrically connecting a semiconductor device comprising a semiconductor chip mounted on a carrier substrate, to a circuit board;

infiltrating a thermosetting resin composition according to claim 1 into the space between the carrier substrate of said semiconductor device and said circuit board; and curing the composition by the application of heat.

15. A method of reducing the coefficient of thermal expansion of a thermosetting resin composition, comprising the steps of:

(a) providing a thermosetting resin component;

(b) providing a lactone-modified silica filler; and (c) forming a premix of the thermosetting resin component and the lactone-modified silica filler; and (d) providing a curative to the premix so formed.

16. The method of claim 15, wherein the thermosetting resin composition has a coefficient of thermal expansion, alpha 1 of at least 4 ppm/° C.

17. The method of claim 15, wherein the thermosetting resin composition has a coefficient of thermal expansion, alpha 1 in the range of about 4 to about 9 ppm/° C.

* * * * *